US006184755B1

(12) United States Patent
Barber et al.

(10) Patent No.: US 6,184,755 B1
(45) Date of Patent: Feb. 6, 2001

(54) ARTICLE COMPRISING A VARIABLE INDUCTOR

(75) Inventors: Bradley P. Barber, Chatam; Peter L. Gammel, Millburn; Victor M. Lubecke, New Providence, all of NJ (US)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/354,711

(22) Filed: Jul. 16, 1999

(51) Int. Cl.[7] .......... H03B 1/00
(52) U.S. Cl. .......... 331/181; 334/71; 336/130
(58) Field of Search .......... 331/181; 334/71, 334/65; 336/130, 20, 122, 123

(56) References Cited

U.S. PATENT DOCUMENTS 1,608,993 * 1/1926 Pfanstiehl et al. .......... 336/123
1,861,869 * 6/1932 Long .......... 171/777
1,961,783 * 6/1934 Roder .......... 171/242
2,308,863 * 1/1943 Craymer .......... 201/48
2,448,642 * 9/1948 Wilburn .......... 171/777
2,685,070 * 7/1954 Childs .......... 336/123

OTHER PUBLICATIONS

Gammel et al. "Design, Test and Simulation of Self–Assembled, Micromachined RF Inductors," SPIE vol. 3680, pp. 581–591, Part of the Symposium on Design, Test and Microfabrication of MEMS and MOEMS, Mar.–Apr. 1999, Paris, France.

Young et al. "A Low–Noise RF Voltage–Controlled Oscillator Using On–Chip High–Q Three–Dimensional Coil Inductor and Micromachined Variable Capacitor," Tech. Dig., pp. 128–131, Solid State Sensor and Actuator Workshop, Jun. 8–11, 1998, Hilton Head Island, South Carolina.

Fan et al., "Universal MEMS Platforms for Passive RF Components: Suspended Inductors and Variable Capacitors," IEEE Proc., pp. 29–33, Eleventh Annual Int'l. Conf. MEMS, Jan. 25–29, 1998, Heidelberg, Germany.

"MEMS Technology Pursued for the Development of Micromachined Silicon Variable Inductors and Latching Accelerometers," Elec. Design, Jun. 23, 1997.

Pehlke et al., "Extremely High–Q Tunable Inductor for Si–Based RF Integrated Circuit Applications," IEEE Proc., pp. 63–66, Int'l. Electron Devices Meeting, Dec. 7–10, 1997, Washington, D.C.

* cited by examiner

*Primary Examiner*—Robert Pascal
*Assistant Examiner*—Henry Choe
(74) *Attorney, Agent, or Firm*—DeMont & Breyer, LLC

(57) ABSTRACT

A micromechanical variable/tunable inductor is disclosed. The present inductor comprises at least two elements capable of supporting spatial electromagnetic coupling and means for varying a geometrical relationship thereof. Varying the geometrical relationship between such elements varies the inductance of the inductor. In some embodiments, the geometrical relationship that is varied is the spacing between the two elements. The spacing is varied by creating a differential movement between such elements. In further embodiments, the present invention comprises resonant circuits incorporating such variable inductors, and oscillators including such resonant circuits.

23 Claims, 6 Drawing Sheets

ARTICLE COMPRISING A VARIABLE INDUCTOR

STATEMENT OF RELATED CASES

The present case is related to the following U.S. patent applications Ser. Nos. 09/152,185 and 09/152,189, both of which were filed Sep. 12, 1998.

FIELD OF THE INVENTION

The present invention relates to inductors. More particularly, the present invention relates to a micromechanical variable inductor and circuits for use therewith.

BACKGROUND OF THE INVENTION

Inductors and variable inductors are useful and/or required circuit elements in a variety of important applications and products. For example, inductors and variable inductors are necessary elements of many RF-wireless products. In particular, they are used for matching and loading low noise amplifiers, power amplifiers and mixers, as well as for providing frequency- selective resonant circuits in variable-frequency oscillators in such RF-wireless products.

In a typical cellular telephone, inductors, and other "passive" components (e.g., capacitors and resistors) may occupy over 90 percent of the circuit-board space, and outnumber active devices by more than ten-to-one. As the functionality of such a telephone continues to be integrated into progressively fewer chips, the passive components that are not easily integrated have come to dominate the board-level design. Thus, it would be desirable to fabricate semiconductor-integrable passive components.

Several difficulties have impeded the development of such semiconductor-integrable passive components. Regarding inductors, important performance parameters for RF applications include the "quality factor," Q, (i. e., the relative absence of resistive losses) and obtaining a suitably high self-resonant frequency. Unfortunately, a performance improvement in one of such parameters is typically obtained at the expense of the other parameter. For example, increasing the size of an inductor will typically reduce resistive losses, but it will also lower its resonant frequency.

In the prior art, active circuits are typically used to "tune" or vary inductance in integrated circuits. Such an approach has several disadvantages, including degraded phase noise, relatively high power requirements and limited dynamic range.

A prior-art implementation of variable inductor that is described to be useful for silicon-based RF integrated circuit applications has been disclosed by Pehlke, et al in "Extremely High-Q Tunable Inductor for Si-Based RF Integrated Circuit Applications," 1997 IEEE Int'l Electron Devices Meeting, at 3.4.1–3.4.4., Washington, D.C., Dec. 7–10, 1997. That tunable inductor uses a variable-phase shifter to vary Q and inductance. While reported performance was good, the presence of the phase shifter is undesirable.

SUMMARY OF THE INVENTION

A variable/tunable inductor is disclosed wherein the geometry of the inductor is altered to vary inductance. More particularly, in accordance with the illustrated embodiments and in contrast with the prior art, the present inductors comprise at least two elements that support spatial electromagnetic coupling and means for varying a geometrical relationship thereof. Varying the geometrical relationship between such elements varies the inductance of the inductor.

In one embodiment, a variable inductor in accordance with the present teachings comprises a ground plane, an electrically-conductive planar loop spaced therefrom, and means for varying a geometrical relationship between the ground plane and the loop. In another embodiment, a variable inductor comprises two electrically-conductive planar loops that are spaced from each other and means for varying a geometrical relationship between the two loops.

In the illustrated embodiments, the geometrical relationship that is varied is the spacing between the loop and the ground plane or the spacing between the two loops. In various embodiments, the spacing is varied by creating a differential movement between the relevant elements.

In the illustrated embodiments, such differential movement is generated (1) by restraining the movement of one of the elements or (2) by varying a parameter/property of the two elements such that the elements respond differently to an actuating stimulus. The varied parameter may include, without limitation, element (e.g., loop) thickness, material of fabrication, and structural implementation. In the illustrated embodiments, the actuating stimulus includes temperature, electrostatic force, electromechanical impulsion and magnetic force.

In further embodiments, the present invention comprises resonant circuits incorporating such variable inductors, and oscillators including such resonant circuits.

DETAILED DESCRIPTION

Figure 1:
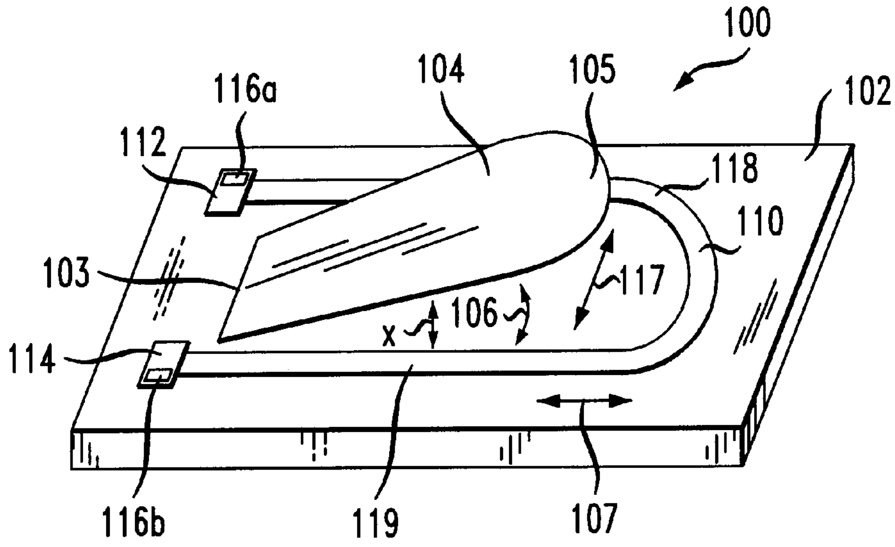
FIG. 1 depicts a first embodiment of a variable inductor in accordance with the present teachings.

The present invention provides a variable inductor, and circuits utilizing same. Such variable inductors are advantageously fabricated on an "integrable" support, such as, without limitation, silicon, germanium and the like. It should be understood, however, that there are applications in which it is desirable to fabricate the present passive variable inductors on a "non-integrable" support, such as glass or other non-conducting or low-dielectric-constant substrates. Applications for non-integrable supports include, for example, "drop in" replacement of existing inductors. The present variable inductors are suitable for use in conjunction with such non-integrable supports, as well as with applications using integrable supports.

Several illustrative resonant circuits in accordance with the present teachings are described later in this Specification after the present variable inductor is described.

The total inductance, $L_{RF}$, of a passive inductor is given by:

$$L_{RF}=L_{SELF}+M \quad [1]$$

The two contributions to total inductance include (1) a self inductance term, $L_{SELF}$, and (2) a mutual inductance term, M. The self inductance term derives from the geometry of segments of the inductor. The mutual inductance term derives from the geometry, spatial separation and relative phase of currents carried by different segments comprising the inductor. The impact of such geometric and phase relationships on inductance is well understood. Inductance is varied or "tuned" by changing the self inductance term, or the mutual inductance term, M. In accordance with the present teachings, inductance is changed by varying the geometry/spatial separation of the segments of the inductor.

FIGS. 1–4B depict several illustrative embodiments of a variable inductor in accordance with the present teachings. In all of such illustrative embodiments, inductance is changed by varying the geometry/spatial separation of various elements or segments of the inductor. It will be understood that the elements or segments must comprise a material that supports spatial electromagnetic coupling. Suitable materials include, without limitation, electrically-conductive materials, magnetic materials that are not electrical conductors (e.g., ferromagnetic glasses), and super conductors.

In the illustrated embodiments, some of the inductive elements that exhibit electromagnetic coupling are referred to as "loops" and depicted as having a "u" shape. It should be understood that such inductive elements can have an arbitrary shape. That is, they need not be loops, need not be "u-" shaped or have any particular shape at all. In fact, in some embodiments, such inductive lines are straight. As used herein, the term "loop," when referring to elements that exhibit electromagnetic coupling, is meant to indicate an arbitrary geometry, including spirals, loops (including ellipsoidal, circular, rectangular, etc. loops), straight lines and any other suitable configuration.

For clarity of illustration, the means or stimuli by which such geometry is altered (e.g., an actuator, an actuating stimulus) is not depicted in FIGS. 1–4B nor described in conjunction therewith. Actuation devices/stimuli are described later in this Specification.

In the embodiment depicted in FIG. 1, illustrative variable inductor 100 comprises "loop" 110, ground plane 104 and support 102, interrelated as shown. Inductor 100 is configured so that a differential motion can be generated between loop 110 and ground plane 104. In the illustrated embodiment, loop 110 is "fixed" to support 102, while ground plane 104 is movable at free end 105 along direction vector 106 but is restrained at fixed end 103. Since loop 110 is restrained from moving, movement of ground plane 104 causes a differential motion between that loop and the ground plane. A signal, such as an RF signal, is delivered to loop 110 at contacts 116*a* and 116*b*. Support 102 can suitably be semiconductor-integrable, or not, as desired.

The presence of ground plane 104, which in some embodiments comprises a metal, affects mutual inductance between inductor segments 118 and 119. As previously noted, the inductance of an inductor, such as inductor 100, is a function of such spacing, among other factors.

When free end 105 of ground plane 104 is raised off of support 102 (e.g., rotated about fixed end 103) such that the ground plane is not co-planar with loop 104, the distance x between ground plane 104 and inductor segments 118 or 119 varies along the direction vector 107. As such, the mutual inductance term between segments 118 and 119 varies along direction vector 107.

As ground plane 104 is moved along direction vector 106, the distance x between the ground plane and any point along inductor segments 118 and 119 changes, increasing or decreasing depending upon the ground plane's direction of motion. As a result of such movement, effective electrical spacing 117 changes, so that self inductance is changed between different segments of loop 110 (e.g., any point along segments 118 and 119), thereby changing the inductance of inductor 100.

In an alternate embodiment (not depicted), loop 110 is movable, while ground plane 104 is non movable. In such an embodiment, loop 110 can be fixed to support 102 at anchors, such as anchors 112 and 114, about which loop 110 can rotate. As described later in this Specification, movement generated in ground plane 104 (or in loops, such as loop 110) may, as a function of the actuation method, arise from a "warping" of the ground plane (or loop), rather than a true rotation about a fixed end thereof. In this Description and the appended Claims, the terms "movement," "movable," "rotation" or the like, when used to describe motion of an unrestrained ground plane or loop, includes warping and/or rotation about a fixed point.

In some embodiments, ground plane 104 comprises a magnetic material, or is otherwise rendered magnetic. Relatively larger changes in inductance can be realized for a given movement along direction vector 106 when ground plane 104 is magnetic.

It will be understood that while loop 110 (and loops shown in other Figures depicting other embodiments) has a single turn, loops having multiple turns may suitably be used in conjunction with the present invention. Additional turns will result in higher values of inductance for the inductor.

Figure 2:
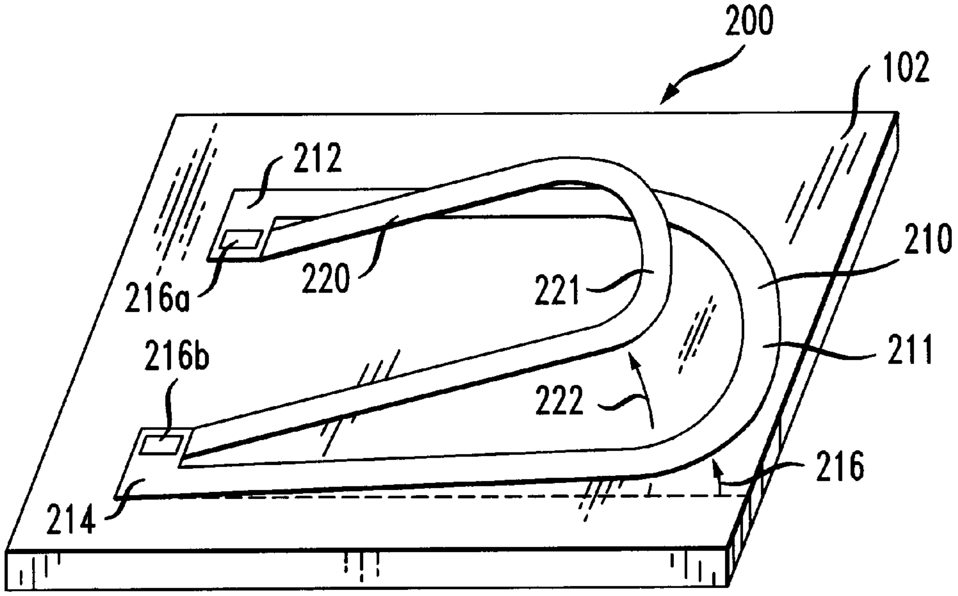
FIG. 2 depicts a second embodiment of a variable inductor in accordance with the present teachings.

A second illustrative embodiment of a variable inductor 200 is depicted in FIG. 2. Inductor 200 comprises two loops—outer loop 210 and inner loop 220. Both loops are anchored at anchors 212, 214. Loop 210 is movable at free end 211 as indicated by direction vector 216, and loop 220 is movable at free end 221 as indicated by direction vector 222. A signal, such as an RF signal, is delivered to loops 210 and 220 at contacts 216*a* and 216*b*.

The loops are suitably arranged, actuated, etc., as described later in this Specification, such that a differential motion between loops 210 and 220 can be generated. In other words, the loops move relative to one another such that a change in geometry/spacing results with such movement. As previously described, such a change results in a change in inductance.

Figure 3A:
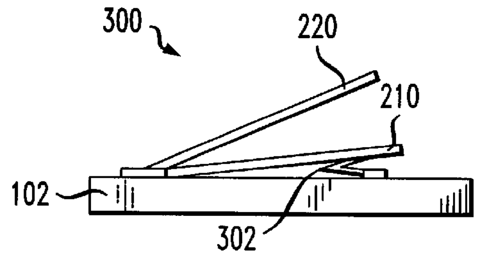
FIGS. 3A and 3B depict a third embodiment of a variable inductor in accordance with the present teachings.
Figure 3B:
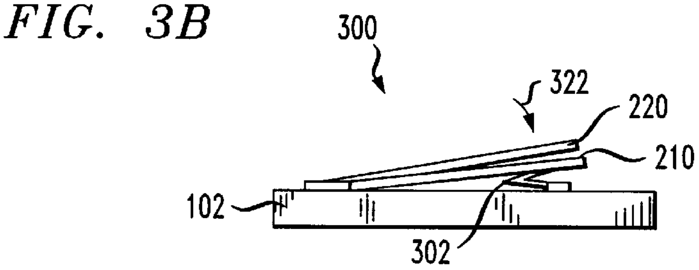

Illustrative variable inductor 300 depicted in FIGS. 3A and 3B includes two-loops like inductor 200. Inductor 300 differs from inductor 200 in that outer loop 210 of illustrative inductor 300 is restrained from moving by hooks 302. Hooks 302 maintain loop 210 in a position relatively near to support 102. Inductance is varied as unrestrained inner loop 220 is moved upwardly or downwardly. FIG. 3B shows inner loop 220 moving downwardly along direction vector 322 towards restrained outer loop 210. When the inner and outer loops are co-planar, self-inductance is maximized.

Figure 4A:
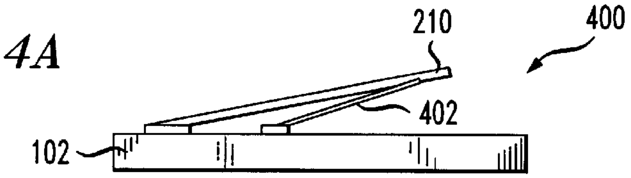
FIGS. 4A–4C depict a fourth embodiment of a variable inductor in accordance with the present teachings.
Figure 4B:
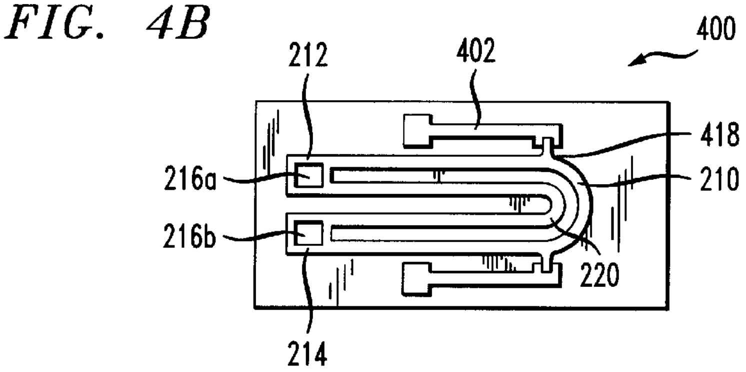
Figure 4C:
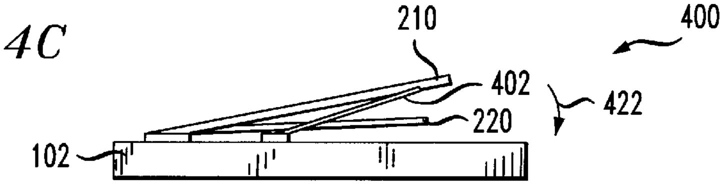

Illustrative variable inductor 400 depicted in FIGS. 4A–4C also has two-loops. In inductor 400, outer loop 210 is supported by supports 402. Members 418 depending from outer loop 210 rest on supports 402 (FIG. 4B). In such manner, downward motion of loop 210 is substantially prevented. In contrast to inductor 300, supports 402 raise loop 210 to a position relatively distant from support 102. Inductance is varied as unrestrained inner loop 220 is moved upwardly or downwardly. FIG. 4A depicts the inner and outer loops disposed in co-planar relation. FIG. 4C shows inner loop 220 moving downwardly along direction vector 422 away from restrained outer loop 210.

The present variable inductors utilize a differential motion between inductor segments (or inductor segments and a ground plane) to vary inductance. The manner in which such differential motion is developed is now described.

In one embodiment, a change in temperature can be used as an actuation stimulus. For example, to create such a change in temperature, the inductor can be disposed in a micro-sized oven or a cooler. To generate differential movement between inductor segments, etc., the segments must respond differently to temperature. Such different responses can be achieved, for example, by varying the thickness of the inductor segments, utilizing different metals, and varying the mechanical design, such as by corrugating the surface of one of the segments.

Figure 5:
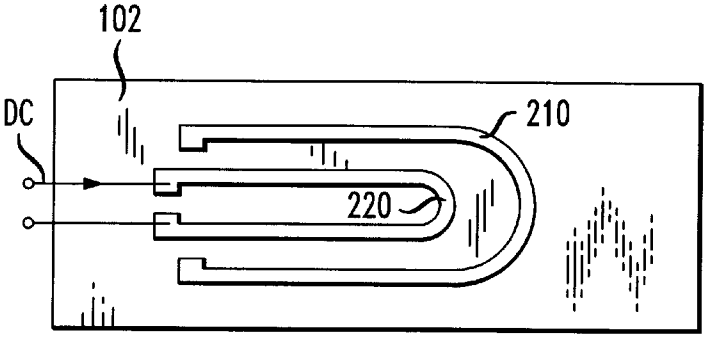
FIG. 5 depicts an illustrative arrangement for thermal actuation.

Alternatively, a DC bias can be applied to one of the loops to selectively heat that loop. For example, as depicted in FIG. 5, bias is applied to loop 220, such that loop 220 will be selectively heated.

The movement generated by thermal actuation is typically a "warping" of the loop or ground plane. Such warping is depicted, for the case of fixed inductors, in Gammel et al., "Design, Test and Simulation of Self-Assembled, Micromachined RF Inductors," Symposium on Design, Test and Microfabrication of MEMS and MOEMS, Paris, France, March–April 1999, reprinted in SPIE vol. 3680 at pp. 582–591.

Inductor 300 depicted in FIGS. 3A and 3B, and inductor 400 depicted in FIGS. 4A–4C, are well adapted for use in conjunction with thermal actuation. For example, as temperature is reduced, an unrestrained loop tends to "warp," rising away from support 102. As temperature increases, the loop lends to assume a planar form.

Figure 6:
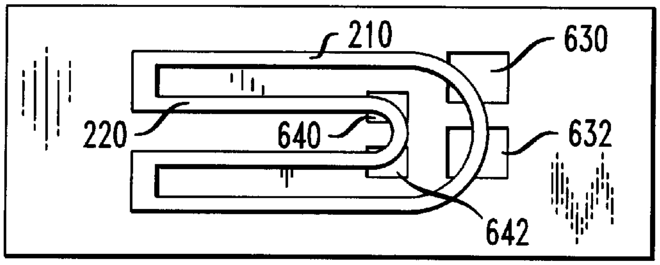
FIG. 6 depicts an illustrative arrangement for electrostatic actuation.

In another embodiment, the movable member(s) is electrostatically actuated. FIG. 6 depicts an arrangement for electrostatic actuation wherein electrodes 630 and 632 are disposed beneath the "free end" of loop 210, and electrodes 640 and 642 are disposed beneath free end of loop 220. A DC bias is applied to the electrodes generating an electrostatic force that attracts the associated loop. The magnitude of the bias voltage controls the electrostatic force and the amount of movement (i.e., deflection) of the loop.

Figure 7:
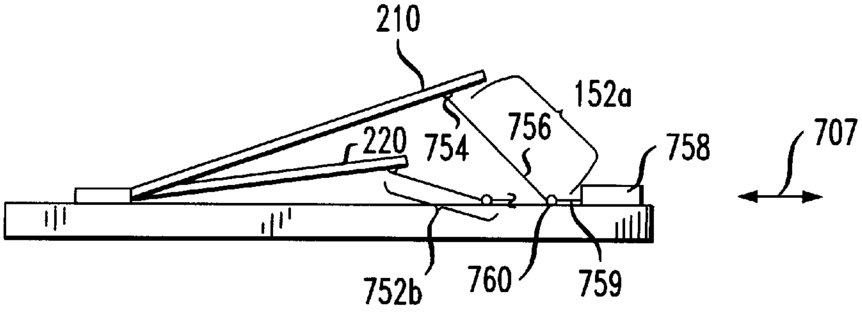
FIG. 7 depicts an illustrative arrangement for electromechanical actuation.

In a further illustrative embodiment depicted in FIG. 7, loops 210 and 220 are electromechanically actuated. In particular, loop 210 is actuated via actuator 758 that mechanically engages that loop via linkage 152*a*. The action of illustrative actuator 758 causes member 759 to move along direction vector 707 in a substantially "horizontal" or "in-plane" motion. Such in-plane movement is converted to a "vertical" lifting or "out-of-plane" motion via the operation of linkage 152*a*. Illustrative linkage 152*a* comprises rigid arm 752 that connects to loop 210 via hinge 754 and connects to actuator 758 via hinge 760. Loop 220 is similarly actuated via an actuator (not shown for clarity) that is mechanical connected thereto via linkage 752*b*.

Actuators suitable for use in conjunction with the present invention include, for example, well known scratch drives, comb drives and any of a variety of other suitable configurations for electromechanical actuation well known in the art.

The present variable inductors can be fabricated with standard micromachining techniques, such as, for example, the multi-user MEMS (micro electromechanical systems) process, "MUMPs" available from MEMS Microelectronics Center of North Carolina (MCNC) in Research Triangle Park, N.C.

One of MCNC's MUMPs technology is a three-polysilicon layer surface micromachining process. That process allows for a first deposited layer, referred to as "POLY0," that is "non-releasable" and is typically used for patterning address electrodes and local wiring on a support. Thus, the POLY0 layer can be used to form, for example, electrodes 630, 632, 640 and 642 (see FIG. 6) that are useful for electrostatic actuation of inductor loops. The upper two polysilicon layers, referred to as "POLY1" and "POLY2," are "releasable" and so can be used to form mechanical structures such as elements of an actuator or movable loops and ground planes. The POLY1 and/or POLY2 layers are released by etching away sacrificial oxide layers that are deposited between the polysilicon layers during fabrication.

The polysilicon layers POLY0, POLY1 and POLY2 have nominal thicknesses of 0.5, 2 and 1.5 microns, respectively. The polysilicon and oxide layers are individually patterned, and unwanted material from each layer is removed by reactive ion etching before the next layer is added. Optionally, a layer of metal, nominally 0.6 to 1.3 microns thick, may be deposited on the POLY2 layer.

MCNC's three-layer process, as well as other MEMS fabrication processes, are now quite familiar to those skilled in the art.

An illustrative method for fabricating an inductor loop, such as illustrative loops 110, 210 and 220, based on the MCNC three-layer process is described below and depicted in FIGS. 8A–8I. The Figures are depicted as side-views for clarity of illustration, such that only a portion of the structure of the inductor loop (e.g., for inductor 100, only anchor 114 and segment 119) is illustrated. Certain layers of material that are deposited when using the MCNC process are not utilized when forming the present structure. To the extent that such unnecessary layers are deposited on the present structure during fabrication, they are completely removed in later lithographic steps. Such non-utilized layers are omitted for clarity of presentation. In the following description and the accompanying Figures, the MCNC designations for the various polysilicon layers will be used.

Figure 8A:
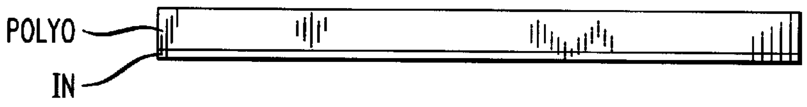
FIGS. 8A–8I depict an illustrative fabrication method.
Figure 8B:

As depicted in FIG. 8A, a first layer POLY0 of polysilicon is deposited on an insulating layer IN, such as silicon nitride. The layer POLY0 is then patterned, using an appropriate mask. The as-patterned layer $POLY0_p$, which will function as an "anchor" for one "end" of inductor loop, is shown in FIG. 8B.

Figure 8C:
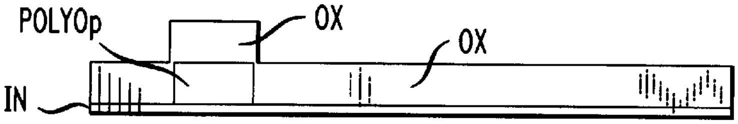
Figure 8D:
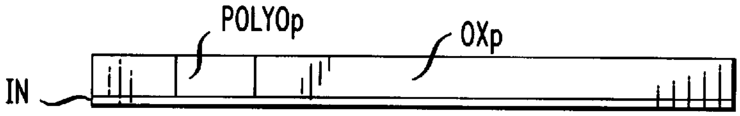

Subsequently, a layer OX of oxide is deposited over the layer IN and the layer $POLY0_p$, as depicted in FIG. 8C. Next, layer OX of oxide is patterned as shown in FIG. 8D.

Figure 8E:
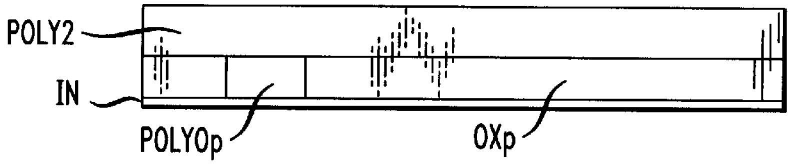
Figure 8F:
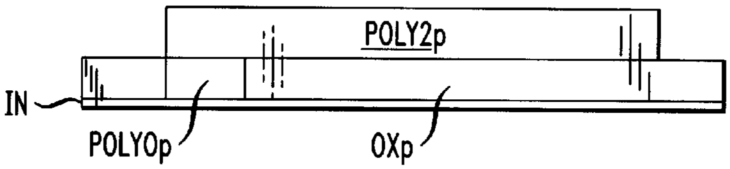

In FIG. 8E, a layer POLY2 of polysilicon is deposited on the patterned layers $OX_p$ and $POLY0_p$. The inductor loop and supports are formed from the layer POLY2. As such, the layer POLY2 is patterned, using an appropriately configured mask, into such structures. The patterned layer $POLY2_p$ is depicted in FIG. 8F.

Figure 8G:
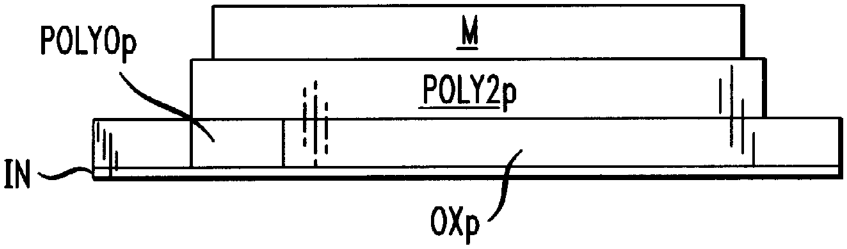
Figure 8H:
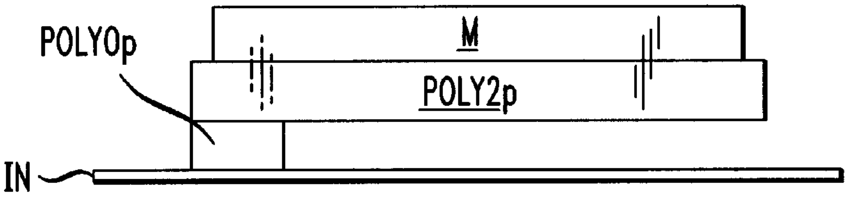

After patterning the layer POLY2, a layer M of metal is deposited on layer $POLY2_p$, and then patterned. The metal is deposited over the supports, as well as the loop, and provides a conductive surface. FIG. 8G depicts the patterned layer M on the patterned layer $POLY2_p$. Finally, the layer OX of oxide is etched, such as with HF, releasing the patterned layer $POLY2_p$, as is depicted in FIG. 8H.

In some embodiments, two layers of metal, as opposed to a single layer, are deposited everywhere on inductor 102 to reduce electrical resistance as compared to a single layer. In still other embodiments, three or more layers of metal are used to further reduce electrical resistance. Any one of a variety of metals may suitably be used for such purpose, including for example, aluminum, copper, silver or gold. As is known to those skilled in the art, gold is typically not used in conjunction with CMOS processes. As such, in embodiments in which the present variable inductor is to be incorporated into a CMOS chip, the other metals listed above should be used in preference to gold.

Figure 8I:
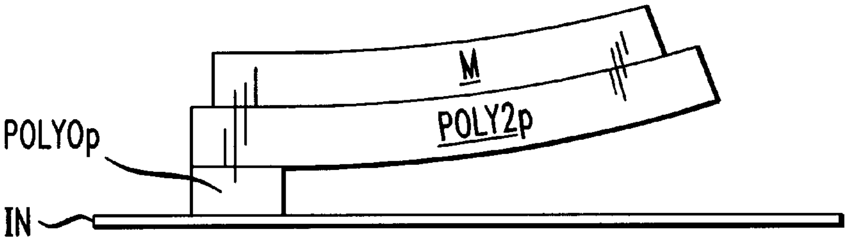

In some embodiments, such as for variable inductor 400, it is desirable to have at least one of the inductor loops elevated above the substrate. One way to do so is to cause patterned layer $POLY2_p$ to "warp" as it is released, such that the non-anchored end moves upwardly away from the layer IN disposed on the support, as depicted in FIG. 8I.

Such upward warping can be caused by depositing a "stressed layer" over the structural layer (e.g., the patterned layer POLY2 in the previous example) of the structure that is to be warped. The stressed layer comprises a layer of material that is deposited such that it has a high level of intrinsic stress.

For example, as described above, metal is deposited on the POLY2 layer to provide a conductive surface. That metal is typically gold (for non-CMOS applications). Gold does not, however, adhere well to polysilicon. As such, a thin adhesion layer is often deposited on the POLY2 layer before depositing gold. In one embodiment, the adhesion layer is the stressed layer.

The adhesion layer is advantageously chromium or refractory metals like titanium or tungsten, since a high intrinsic stress is associated with deposited chromium, titanium, tungsten, etc. When the sacrificial oxide layer is etched away to release the patterned layer $POLY2_p$, the chromium, etc., layer contracts to minimize strain. Upon such contraction, an upwardly-directed force is imparted to the non-anchored end of patterned layer $POLY2_p$, causing it to warp in an "upwards" direction.

In an alternative embodiment (not shown), patterned layer $POLY2_p$ is fabricated with compressive stress, and an overlying layer (e.g., metal) is deposited with low stress. Upon release, the $POLY2_p$ layer expands, causing the same upwardly directed warp.

In the aforedescribed illustrative fabrication method, the POLY1 layer of the MCNC process is not used; rather the POLY2 layer is used. There are several reasons for this. First, since the POLY2 layer, at 1.5 microns, is thinner than the POLY1 layer (2 microns), the POLY2 will be more amenable to "warping." Second, to impart the requisite conductivity to the loop, metal is advantageously deposited on the structural (e.g., polysilicon) layer comprising those structures. In the MCNC process, metal cannot be deposited on the POLY1 layer, but can be deposited on the POLY2 layer.

While the above-described method utilized MCNC's three-polysilicon layer MEMS fabrication technology, it should be understood that inductor loops can be fabricated using other surface micromachining processes.

As previously described, the total inductance, $L_{RF}$, of a passive inductor is given by:

$$L_{RF}=L_{SELF}+M, \tag{1}$$

where: $L_{SELF}$ is self inductance and M is mutual inductance term.

Figure 9:
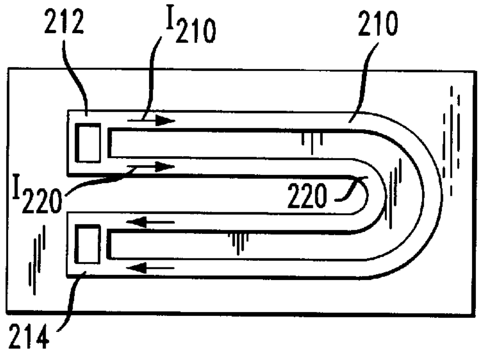
FIG. 9 depicts an arrangement for generating a positive mutual inductance term.

In a further embodiment, total inductance is influenced by the direction of current flow through the inductor. When parallel currents flow in a concurrent direction in adjacent lines, as illustrated by currents $I_{210}$ and $I_{220}$ in respective inductor loops 210 and 220 depicted in FIG. 9, a positive mutual inductance results. When parallel currents flow in a countercurrent direction in adjacent lines, as illustrated by currents $I_{310}$ and $I_{320}$ in respective inductor loops 210 and 220 depicted in FIG. 10, a negative mutual inductance results.

Figure 10:
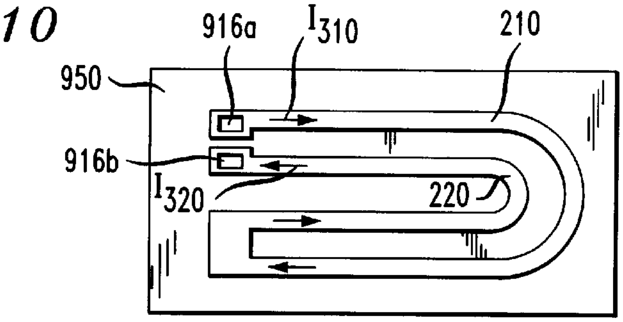
FIG. 10 depicts an arrangement for generating a negative mutual inductance term.

For countercurrent flow, the two inductor loops 210 and 220 are electrically isolated from one another at at least one end of the loops, such as end 950 in FIG. 10. At end 950, loop 210 terminates with electrical contact 916*a* and loop 220 terminates with electrical contact 916*b*. The contacts 916*a* and 916*b* are physically separated.

The variable inductors depicted in FIGS. 1–4*c* are configured for concurrent flow. It will be appreciated that in other embodiments, the present inductors can be readily configured for countercurrent flow.

By virtue of its small size, and compatibility with CMOS processing, the present variable inductor can advantageously be monolithically integrated into a number of important circuits via commercial-scale processing. At a most basic circuit level, the present variable inductor can be used to provide an improved version of the well-known tunable LC circuit. A tunable LC circuit in accordance with the present teachings comprises a signal generator and a capacitor that are electrically connected to a variable inductor in accordance with the present teachings. Such a circuit may be arranged in either a series or parallel configuration, as is well known in the art.

Such tunable LC circuits are used to provide improved variable-frequency oscillators, filters, and other important circuits in wireless telecommunications and other applications. In one embodiment, the present invention provides a radio-frequency oscillator. In that context, an oscillator is a device or circuit that converts DC power to RF power. Improved oscillators in accordance with the present teachings include the present variable inductor in a variety of well-known configurations.

Figure 11:
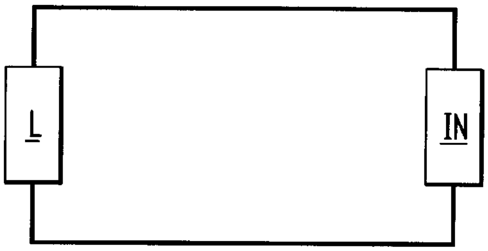
FIG. 11 PRIOR ART
FIG. 11 is a conceptual depiction of a one-port negative resistance oscillator in the prior art.

One such configuration is a one-port negative resistance oscillator, which is conceptually depicted in FIG. 11. Such an oscillator can be conceptualized as including load L and negative-resistance input device IN. Typically, the negative resistance device is a Gunn or IMPATT diode, which is biased to create a negative resistance. In accordance with the present teachings, the load comprises a resonant structure, such as an LC circuit including the present variable inductor.

Figure 12:
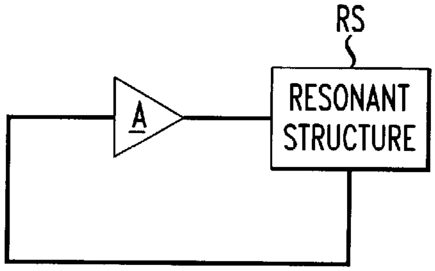
FIG. 12 PRIOR ART
FIG. 12 is a conceptual depiction of a conventional amplifer-based variable-frequency oscillator.

Another oscillator configuration implements the function of negative resistance using an amplification device. FIG. 12 depicts a conventional amplifier-based variable-frequency oscillator. Such an oscillator includes a frequency-dependent or resonant structure RS and an amplification device A. The power output port can be on either side of amplification device A, which is commonly implemented as a transistor.

In an improved amplifier-based variable-frequency oscillator in accordance with the present teachings, resonant structure RS comprises an LC circuit including the present variable inductor. The amplifier is implemented such that it is operable, at an input, to monitor the rf signal in the resonant structure, and is further operable, at an output, to inject an amplified signal into the resonant structure in a manner best suited to sustain oscillations in the resonant structure. Those skilled in the art will be able to design an amplification device suitable for providing the above-described functions.

In some of the embodiments described above, it is advantageous or necessary to integrate methods for making the present variable inductor with CMOS processing. Integrating methods are commercially available, and are generally readily adaptable to meet the needs of a particular application. One such process is the "BiMOSIIe®" process available from Analog Devices, Inc. of Norwood, Mass. The BiMOSIIe® process integrates a surface micromachining process suitable for forming MEMS structures with a CMOS process suitable for forming devices useful for analog applications. Information concerning the BiMOSIIe® process is provided on Analog Devices/MCNC server pages at http://imems.mcnc.org. See also, U.S. Pat. Nos. 5,326,726 and 5,620,931 to Tsang et al., incorporated by reference herein.

Additionally, method for monolithically integrating MEMS structure in a CMOS chip are offered by the University of California at Berkeley, and Sandia National Labs of Albuquerque, N. Mex.

It is to be understood that the embodiments described herein are merely illustrative of the many possible specific arrangements that can be devised in application of the principles of the invention. Other arrangements can be devised in accordance with these principles by those of ordinary skill in the art without departing from the scope and spirit of the invention. It is therefore intended that such other arrangements be included within the scope of the following claims and their equivalents.

We claim:

1. An article comprising a tunable inductor, the tunable inductor having:

a first planar loop comprising a first material that supports spatial electromagnetic coupling;

a second element comprising a second material that supports spatial electromagnetic coupling, at least a portion of which second element is spaced from said first loop; and an actuator operable to vary the space between said first loop and said second element.

2. The article of claim 1, wherein said second element is a ground plane.

3. The article of claim 1 wherein:

at least a portion of said first planar loop is fixed to a support;

at least a portion of said second element is fixed to said support; and at least one of either said first planar loop and said second element is rotatable about the fixed portion thereof.

4. The article of claim 2, wherein said ground plane is magnetic.

5. The article of claim 1, wherein said actuator is operable to move said first loop.

6. The article of claim 5, wherein said second element is a second planar loop.

7. The article of claim 6, wherein said actuator is operable to move said first loop between a first and a second position, wherein:

in said first position, said first and second loops are co-planar; and in said second position, said first and second loops are not co-planar.

8. The article of claim 7, wherein said second loop is immovable.

9. The article of claim 6, wherein a direction in which current travels in said first loop is the same direction that current travels in said second loop.

10. The article of claim 6, wherein a direction in which current travels in said first loop is the opposite direction that current travels in said second loop.

11. The article of claim 7, wherein:

said first loop comprises a first metal having a first thickness; and said second loop comprises a second metal having a second thickness.

12. The article of claim 11, wherein said first and second thicknesses are different.

13. The article of claim 11, wherein said first and second metals are different.

14. The article of claim 7, wherein said first loop is corrugated.

15. The article of claim 1, wherein said actuator comprises means for applying DC bias to said first loop.

16. The article of claim 1, wherein said actuator comprises means for DC. electrostatic control.

17. The article of claim 1, wherein said actuator comprises a mechanical linkage.

18. The article of claim 17, wherein said actuator further comprises an electromechanical device that is operatively connected, via said mechanical linkage, to said first loop.

19. The article of claim 1, wherein said article comprises a LC circuit having a signal generator and a capacitor that is electrically connected to said tunable inductor.

20. The article of claim 19, wherein the article comprises a variable-frequency oscillator, said variable-frequency oscillator including a negative-resistance device that is electrically connected to a resonant structure comprising said LC circuit.

21. An article comprising:

a first planar loop suitable for supporting spatial electromagnetic coupling, wherein a first portion of said first loop is attached to a substrate;

a second element suitable for supporting spatial electromagnetic coupling, wherein said second element is spaced from said first planar loop, and further wherein a first portion of said second element is attached to said substrate; and an actuator operable to vary the space between said first loop and said second element.

22. An article comprising:

a first element suitable for supporting spatial electromagnetic coupling;

a second element suitable for supporting spatial electromagnetic coupling; and an actuator operable to vary a spacing between said first and second elements;

wherein:

said first element and said second element are suitably disposed relative to one another to support spatial electromagnetic coupling therebetween; and at least one of said first element and said second element is rotatable about a fixed end thereof.

23. An article comprising:

a first planar loop suitable for supporting spatial electromagnetic coupling, wherein a first portion of said first loop is attached to a substrate;

a second element suitable for supporting spatial electromagnetic coupling, wherein:

said second element is spaced from said first planar loop;

said second element is not parallel with respect to said first planar loop; and a first portion of said second element is attached to said substrate; and an actuator operable to vary the space between said first loop and said second element.

* * * * *